(12) United States Patent
Chen

(10) Patent No.: US 7,283,375 B2
(45) Date of Patent: Oct. 16, 2007

(54) AUTOMATIC SWITCH

(75) Inventor: Kevin Chen, Taipei (TW)

(73) Assignee: ATEN International Co., Ltd., Taipei (TW)

( * ) Notice: Subject to any disclaimer, the term of this patent is extended or adjusted under 35 U.S.C. 154(b) by 40 days.

(21) Appl. No.: 10/435,611

(22) Filed: May 10, 2003

(65) Prior Publication Data

US 2005/0007746 A1 Jan. 13, 2005

Related U.S. Application Data

(63) Continuation-in-part of application No. 10/190,015, filed on Jul. 8, 2002, now Pat. No. 7,035,112.

(51) Int. Cl.
*H05K 7/14* (2006.01)
(52) U.S. Cl. .................. 361/797; 361/752; 361/800
(58) Field of Classification Search ............... 361/784, 361/800, 752, 797, 686, 715; 439/606, 736, 439/502, 654, 264, 460; 174/65 R, 51
See application file for complete search history.

(56) References Cited

U.S. PATENT DOCUMENTS

| | | | |
|---|---|---|---|
| 2,667,553 A | 1/1954 | Moorhead et al. | |
| 2,870,287 A | 1/1959 | Corbitl et al. | |
| 4,103,252 A | 7/1978 | Bobick | |
| 4,247,600 A * | 1/1981 | Adachi | 428/607 |
| 4,719,314 A * | 1/1988 | Nothnagel et al. | 174/65 R |
| 4,927,787 A | 5/1990 | Patel | |
| 4,927,987 A | 5/1990 | Kirchgessner | |
| 5,192,226 A * | 3/1993 | Wang | 439/502 |
| 5,260,532 A | 11/1993 | Tinder et al. | |
| 5,708,897 A | 1/1998 | Manabe et al. | |
| 5,792,986 A | 8/1998 | Lee | |
| 5,823,352 A * | 10/1998 | Mena et al. | 206/721 |
| 6,133,527 A * | 10/2000 | Park et al. | 174/65 R |
| 6,160,485 A | 12/2000 | Krakovich | |
| 6,329,616 B1 | 12/2001 | Lee | |
| 6,378,014 B1 | 4/2002 | Shirley | |
| 6,449,866 B1 | 9/2002 | Murray | |
| 6,498,890 B1 | 12/2002 | Kimminau | |
| 6,521,836 B1 | 2/2003 | Simonazzi | |
| 6,609,034 B1 | 8/2003 | Behrens et al. | |
| 6,671,756 B1 * | 12/2003 | Thomas et al. | 710/73 |
| 2001/0023141 A1 | 9/2001 | Chang | |
| 2001/0053627 A1 | 12/2001 | Armistead et al. | |
| 2003/0223185 A1 | 12/2003 | Doczy et al. | |
| 2004/0222944 A1 * | 11/2004 | Sivertsen | 345/1.1 |
| 2004/0257761 A1 * | 12/2004 | Park | 361/686 |

* cited by examiner

*Primary Examiner*—Dean A. Reichard
*Assistant Examiner*—Hung S Bui
(74) *Attorney, Agent, or Firm*—Akin Gump Strauss Hauer & Feld LLP

(57) ABSTRACT

An automatic switch includes a main body having a circuit board provided therein, and at least two sets of connectors connected to the main body via signal cables. The main body has an integral enclosure formed through multiple times of injection molding to include a circuit-protecting layer for enclosing the circuit board, an outer case enclosing the circuit-protecting layer, and an anti-slipping layer coating an outer surface of the outer case.

3 Claims, 4 Drawing Sheets

AUTOMATIC SWITCH

The present invention is a continuation in part application of U.S. patent application Ser. No. 10/190,015 filed on Jul. 8, 2002.

FIELD OF THE INVENTION

The present invention relates to an automatic switch for a user to automatically switch between two or more computer configurations, and more particularly to an automatic switch that has a main body having an integrally injection-molded enclosure and signal cables being integrally connected at an end to the main body, and therefore enables convenient connection of the signal cables to different computers and provides absolute protection of an internal circuit board in the main body.

BACKGROUND OF THE INVENTION

The highly developed electronic and information technologies enable people to collect required information or to trade directly over networks via computers, making computers a requisite tool in people's work, learning, entertainments, leisure activities, and daily life.

For people to access two or more computers at the same time, there is developed an automatic switch to enable a user to automatically switch among different signal paths. FIG. 1 shows a conventional automatic switch 40 that is configured into a box 41. The box 41 is internally provided with a circuit board (not shown). Ports 42, 43, and 44 for various types of signal cable connectors are provided on peripheral walls of the box 41. In most cases, the box 41 includes outer walls that are made of metal material or rigid plastic material and assembled together by means of screws (not shown). The automatic switch 40 is normally positioned on a host enclosure of a computer configuration and tends to unexpectedly fall off the host enclosure to result in a damaged circuit board due to vibration. Moreover, when a high humidity exists, moisture in the air tends to attach to the circuit board to cause short circuit. Repair or maintenance of the circuit board is therefore required.

SUMMARY OF THE INVENTION

A primary object of the present invention is to provide a plug-in type automatic switch for a user to access and control multiple computer configurations through one single switch. The automatic switch includes a main body having an internal circuit board. The main body has an integrally injection-molded plastic enclosure to provide good weather-resistance, impact-resistance, and absolute protection of the internal circuit board and circuits thereon.

The automatic switch of the present invention also includes at least two sets of connectors. The connectors are connected to the main body via signal cables.

The integrally injection-molded enclosure of the main body includes a circuit-protecting layer for enclosing the circuit board, an outer case enclosing the circuit-protecting layer, and an anti-slipping layer coating an outer surface of the outer case.

The circuit-protecting layer of the main body is made of a plastic material having a low melting point to avoid damages to circuits provided on the circuit board during the injection molding.

The outer case of the main body has good strength and high rigidity and therefore provides excellent protection to the internal circuit board and the entire main body of the automatic switch.

The anti-slopping layer of the main body has soft surface to enable firm holding of the main body while plugging and unplugging the main body.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
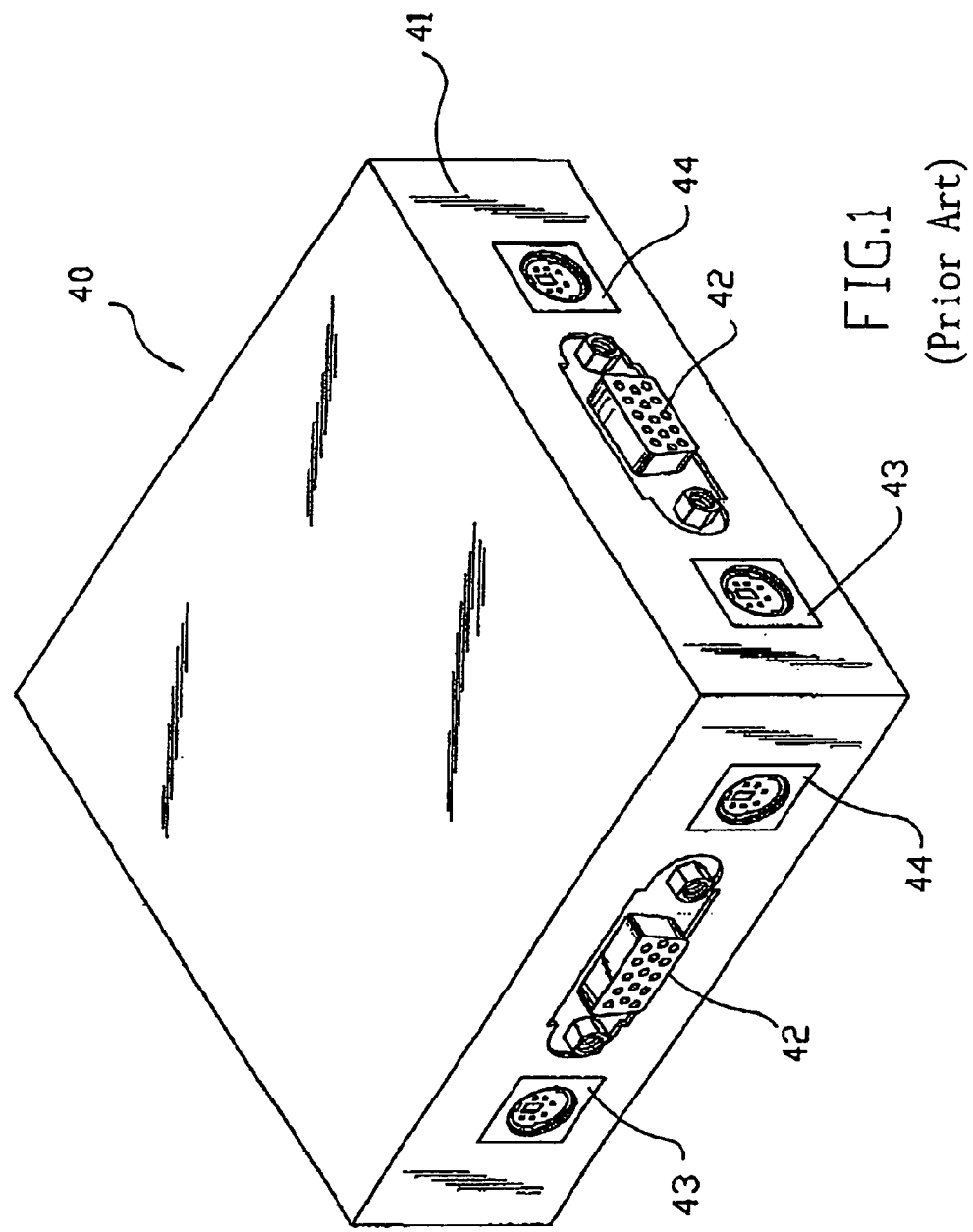
FIG. 1 is a perspective view of a conventional automatic switch for switching between two or more computer configurations.
Figure 2:
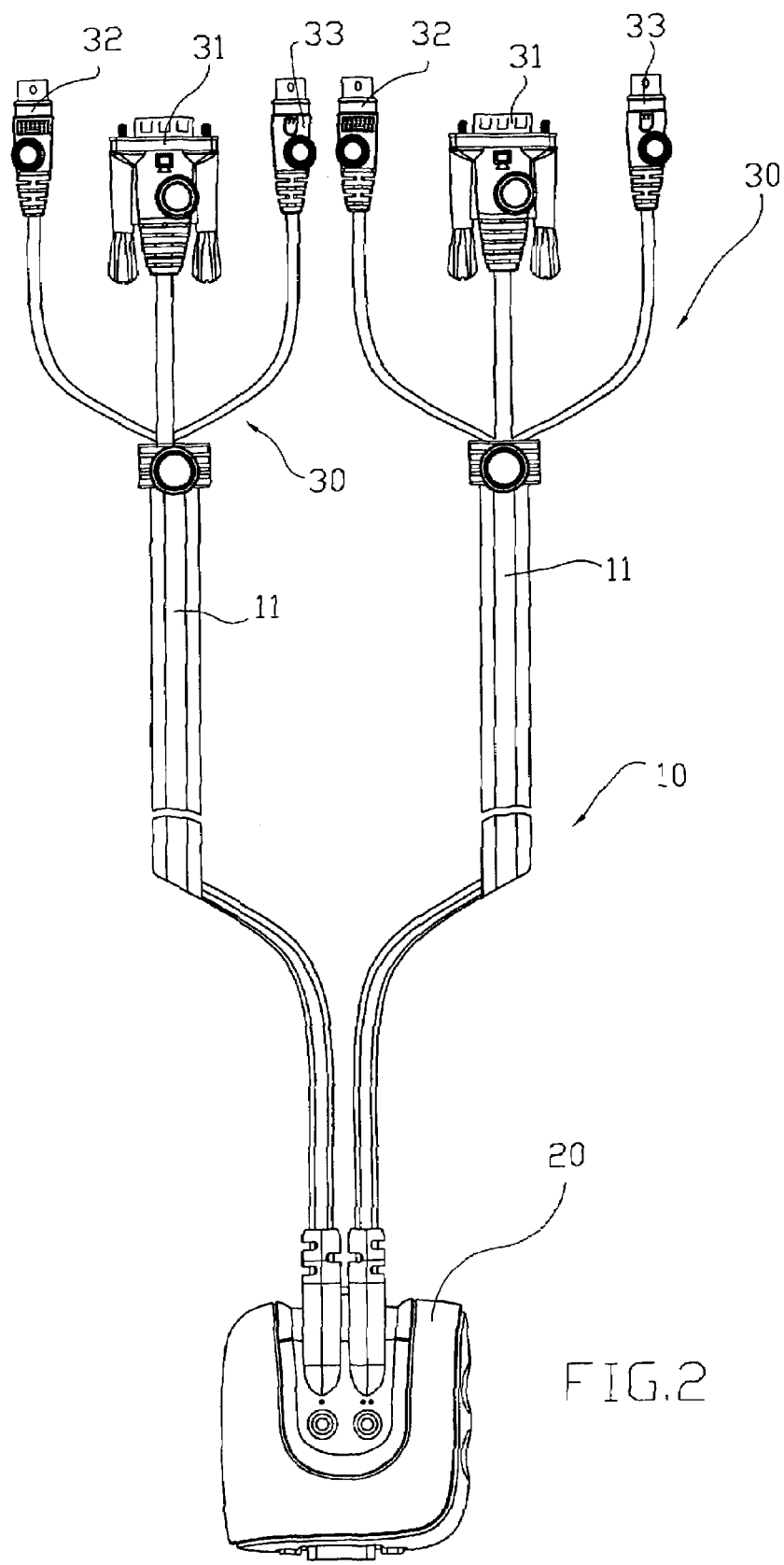
FIG. 2 is a front view of an automatic switch according to the present invention.

Please refer to FIG. 2 that is a front view of an automatic switch 10 according to an embodiment of the present invention. As shown, the automatic switch 10 includes a main body 20 and at least two sets of connectors 30. The main body 20 is internally provided with a circuit board 24 (see FIG. 4), and is connected to the at least two sets of connectors 30 via signal cables 11. As can be seen from FIG. 2, each of the at least two sets of connectors 30 includes a mainframe signal connector 31, a keyboard signal connector 32, and a mouse signal connector 33. In one embodiment, the two sets of connectors 30 can be identical in shape. An end of each of the signal cables 11 is integrally enclosed in an outer case 22 of the main body 20. The cable-connected connectors 31, 32, and 33 are adapted to plug in corresponding connectors (not shown) on computer configurations to which the automatic switch 10 is to be connected.

Figure 3:
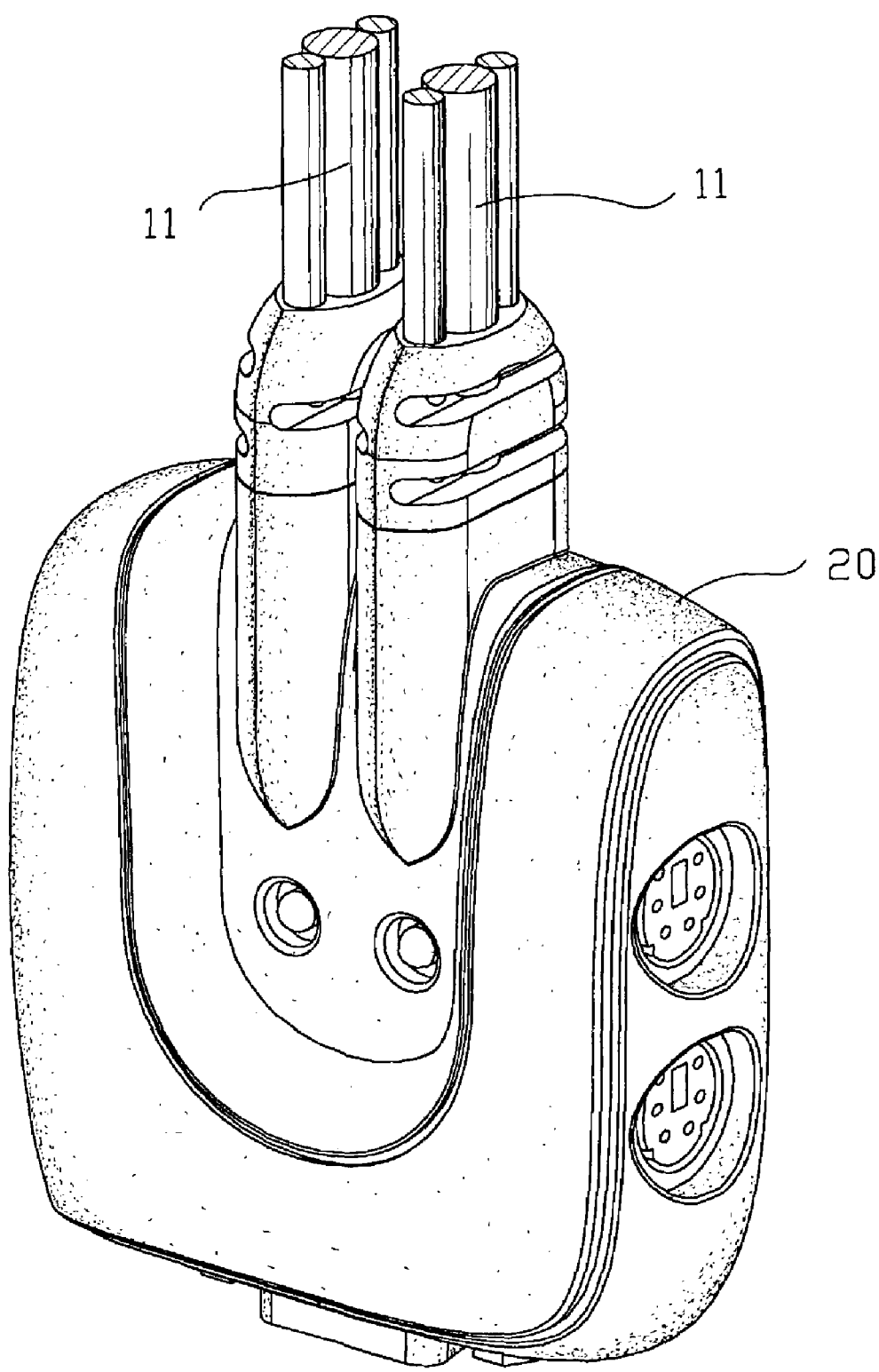
FIG. 3 is a perspective view of a main body of the automatic switch of the present invention.
Figure 4:
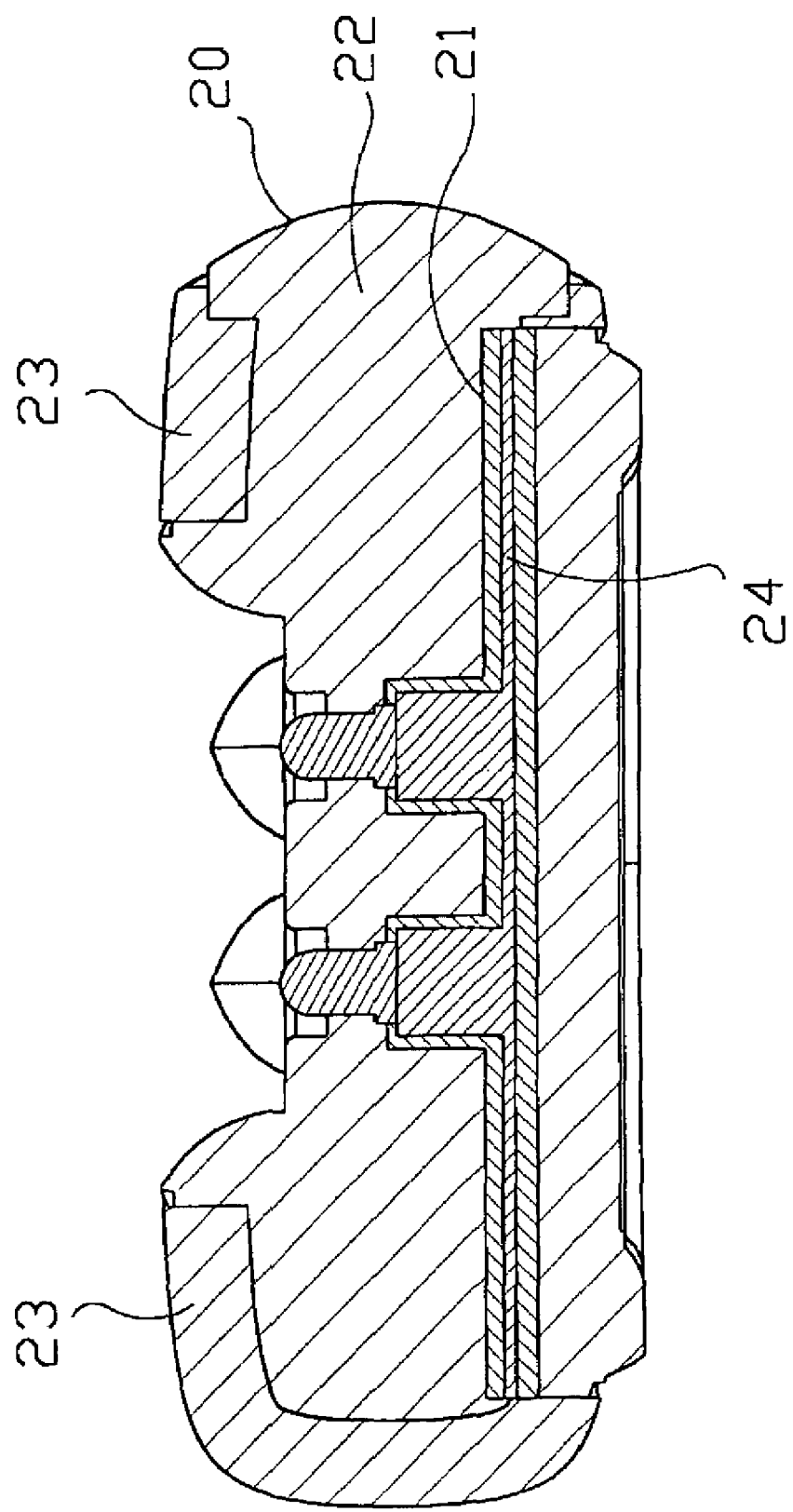
FIG. 4 is a cross-sectional view of the main body of the automatic switch of the present invention.

Please refer to FIGS. 3 and 4 that are perspective and cross-sectional views, respectively, of the main body 20 of the automatic switch 10 of the present invention. The main body 20 has an integral enclosure that is formed through three times of injection molding to include a circuit-protecting layer 21 for enclosing a circuit board 24 provided in the main body 20, an outer case 22 enclosing the circuit-protecting layer 21, and an anti-slipping layer 23 coating an outer surface of the outer case 22. In one embodiment, the inner space of the enclosure is filled by injection molding.

The main body 20 and the at least two sets of connectors 30 are connected together via the signal cables 11 to form a unit body, which enables plugging and connecting of the automatic switch 10 to different computer configurations in a simpler and more convenient manner. Moreover, there are fewer connecting cables to advantageously enable ordered arrangement of the connecting cables.

It is to be noted that the circuit-protecting layer 21 of the main body 20 is in completely close contact with the circuit board 24, so that the circuit board 24 is entirely isolated from and protected against external environments. Electronic components (not shown) soldered onto the circuit board 24 are not subjected to undesired looseness or separation even if the main body 20 is fiercely vibrated or impacted. Moreover, the circuit board 24 enclosed in the circuit-protecting layer 21 is also isolated from moisture in the air to therefore always maintain good electric performance. That is, the circuit board 24 is best protected in the main body 20.

The circuit-protecting layer 21 enclosing the circuit board 24 is made of a plastic material having a low melting point to avoid damages to circuits on the circuit board 24 due to a high temperature in the course of injection molding of the circuit-protecting layer 21.

The outer case 22 enclosing the circuit-protecting layer 21 is made of a plastic material that shows high strength and high rigidity after being molded into a desired shape. The outer case 22 occupies a major part of the enclosure of the main body 20 and serves to ensure a well-shaped overall appearance of the main body 20 while protecting the internal circuit board 24.

The anti-slipping layer 23 coating the outer surface of the outer case 22 is made of a plastic material that provides a soft surface after being molded to enable a user to hold the main body 20 without the risk of easily slipping off therefrom while plugging or unplugging the main body 20.

In brief, the automatic switch 10 of the present invention uses the main body 20 and at least two sets of cable-connected connectors 30 to replace the conventional box-type switch 40, enabling the automatic switch 10 to be used in a more convenient manner. Moreover, the enclosure of the main body 20 of the automatic switch 10 is integrally formed through multiple times of injection molding to protect circuits provided on the internal circuit board 24, making the automatic switch 10 safer and more convenient for use.

What is claimed is:

1. An automatic switch comprising:
    a main body having a circuit board provided therein; and
    at least two sets of connectors, wherein each of said at least two sets of connectors is connected to said main body at a first end and connected to a respective computer at a second end, said first end of each of said sets of connectors is integrally enclosed in an enclosure of said main body, the inner space of the enclosure is filled by injection molding, and said circuit board electrically switches between said at least two sets of connectors to communicate with said respective computer,
    wherein said enclosure of said main body is formed through three times of injection molding to include a circuit-protecting layer for enclosing said circuit board, an outer case enclosing said circuit-protecting layer, and an anti-slipping layer coating an outer surface of said outer case.

2. The automatic switch of claim 1, wherein said outer case occupies a major part of said enclosure of said main body and has a rigid outer surface.

3. The automatic switch of claim 1, wherein said circuit board comprises a plurality of electronic elements enclosed in said circuit-protecting layer.

* * * * *